United States Patent
Ryu

(10) Patent No.: US 10,726,938 B2
(45) Date of Patent: Jul. 28, 2020

(54) DATA STORAGE DEVICE AND OPERATING METHOD THEREOF

(71) Applicant: SK hynix Inc., Gyeonggi-do (KR)

(72) Inventor: Tae Kyu Ryu, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 44 days.

(21) Appl. No.: 16/107,044

(22) Filed: Aug. 21, 2018

(65) Prior Publication Data

US 2019/0214105 A1 Jul. 11, 2019

(30) Foreign Application Priority Data

Jan. 8, 2018 (KR) .................. 10-2018-0002305

(51) Int. Cl.

| G11C 29/52 | (2006.01) |
|---|---|
| G11C 29/08 | (2006.01) |
| G11C 16/10 | (2006.01) |
| G11C 16/26 | (2006.01) |
| G11C 16/34 | (2006.01) |
| G11C 29/44 | (2006.01) |
| G11C 29/04 | (2006.01) |

(52) U.S. Cl.
CPC .............. *G11C 29/52* (2013.01); *G11C 16/10* (2013.01); *G11C 16/26* (2013.01); *G11C 16/3445* (2013.01); *G11C 29/08* (2013.01); *G11C 29/44* (2013.01); *G11C 2029/0407* (2013.01); *G11C 2029/0409* (2013.01); *G11C 2029/0411* (2013.01); *G11C 2029/4402* (2013.01)

(58) Field of Classification Search
CPC ..... G11C 29/52; G11C 16/3445; G11C 16/26; G11C 16/10; G11C 29/08; G11C 2029/0407; G11C 29/44; G11C 2029/0411; G11C 2029/0409; G11C 2029/4402

See application file for complete search history.

(56) References Cited

U.S. PATENT DOCUMENTS

| 2006/0018159 A1* | 1/2006 | Picca ................. | G11C 29/76 365/185.17 |
|---|---|---|---|
| 2015/0074476 A1* | 3/2015 | Kim .................. | G11C 29/44 714/723 |
| 2015/0262712 A1* | 9/2015 | Chen ................. | G11C 29/44 714/723 |
| 2016/0117104 A1* | 4/2016 | Hashimoto ......... | G06F 12/0246 711/171 |

FOREIGN PATENT DOCUMENTS

KR 1020150039370 4/2015

\* cited by examiner

*Primary Examiner* — Thien Nguyen
(74) *Attorney, Agent, or Firm* — IP & T Group LLP

(57) ABSTRACT

A data storage device includes a nonvolatile memory device including a plurality of memory blocks; a random-access memory including a bad block management module configured to register and manage bad blocks included in the plurality of memory blocks; and a processor configured to detect primary bad blocks by performing a primary bad block scan operation on the plurality of memory blocks using the bad block management module, detect secondary bad blocks by performing a secondary bad block scan operation on normal memory blocks other than the primary bad blocks among the plurality of memory blocks, and register the detected primary bad blocks and the detected secondary bad blocks as bad blocks.

12 Claims, 9 Drawing Sheets

DATA STORAGE DEVICE AND OPERATING METHOD THEREOF

CROSS-REFERENCES TO RELATED APPLICATION

The present application claims priority under 35 U.S.C. § 119(a) to Korean patent application number 10-2018-0002305, filed on Jan. 8, 2018, which is incorporated herein by reference in its entirety.

BACKGROUND

1. Technical Field

Various embodiments generally relate to a semiconductor device, and, more particularly, a data storage device and an operating method thereof.

2. Related Art

Recently, the paradigm for the computer environment has been converted into ubiquitous computing so that computer systems can be used anytime and anywhere. Thereby, the use of portable electronic devices such as cellular phones, digital cameras, and notebook computers has rapidly increased. Such portable electronic devices generally employ a data storage device using a memory device for storing data used in the portable electronic devices.

A data storage device using a memory device provides advantages in that, since there is no mechanical driving unit, stability and durability are excellent, information access speed is greatly increased, and power consumption is reduced. Examples of data storage devices having such advantages may include a universal serial bus (USB) memory device, a memory card having various interfaces, and a solid-state drive (hereinafter, referred to as "SSD"). Due to high consumer demand for improved electronic devices demand for improved data storage devices is also very high.

SUMMARY

Various embodiments of the present invention are directed to a data storage device having improved read performance, and an operating method thereof.

In an embodiment, a data storage device may include: a nonvolatile memory device including a plurality of memory blocks; a random-access memory including a bad block management module configured to register and manage bad blocks included in the plurality of memory blocks; and a processor configured to detect primary bad blocks by performing a primary bad block scan operation on the plurality of memory blocks using the bad block management module, detect secondary bad blocks by performing a secondary bad block scan operation on normal memory blocks other than the primary bad blocks among the plurality of memory blocks, and register the detected primary bad blocks and the detected secondary bad blocks as bad blocks.

In an embodiment, an operating method of a data storage device including a nonvolatile memory device, and a controller configured to control an operation of the nonvolatile memory device may include: performing a primary bad block scan operation on memory blocks included in the nonvolatile memory device, and detecting and registering primary bad blocks among the memory block; and performing a secondary bad block scan operation on normal memory blocks other than the primary bad blocks among the memory blocks, and detecting and registering secondary bad blocks among the normal memory blocks.

In an embodiment, a memory system may include: a memory device including a plurality of memory blocks; and a controller suitable for controlling, during booting the memory device, the memory device to perform a program operation to normal memory blocks among the memory blocks such that the normal memory blocks have a predetermined threshold state; controlling the memory device to perform an erase operation a predetermined number of times to one or more among the memory blocks;

controlling the memory device to perform a read operation to the normal memory blocks with a read bias corresponding to the predetermined threshold state; and determining the normal memory block, on which a read fail occurs, as a bad block.

DETAILED DESCRIPTION

Figure 1:
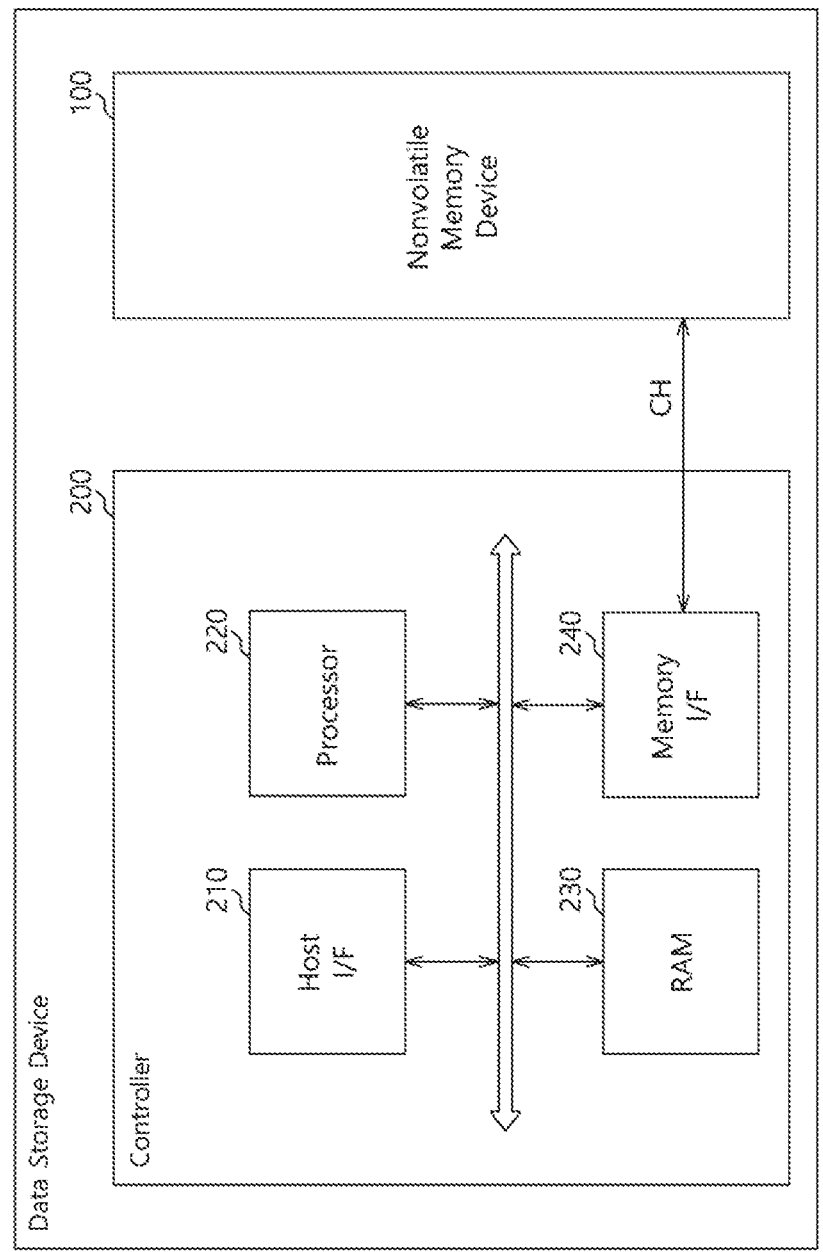
FIG. 1 is a simplified block diagram illustrating a configuration of a data storage device in accordance with an embodiment of the present disclosure.

Hereinafter, a data storage device and an operating method thereof will be described below with reference to the accompanying drawings through various examples of embodiments of the present invention.

The present invention may, however, be embodied in different forms and should not be construed as being limited to the embodiments set forth herein. Rather, these embodiments are provided to describe the present invention in detail to the extent that a person skilled in the art to which the invention pertains can enforce the technical concepts of the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, B, and C.

As used herein, the term "and/or" includes any and all combinations of one or more of the associated listed items.

As used herein, singular forms are intended to include the plural forms as well, unless the context clearly indicates otherwise.

It will be further understood that the terms "includes," and "including" are used interchangeably in this specification with the open-ended terms "comprises," and "comprising," to specify the presence of any stated elements and to not preclude the presence or addition of one or more other non-stated elements.

In the following description, numerous specific details are set forth in order to provide a thorough understanding of the present invention. The present invention may be practiced without some or all these specific details. In other instances, well-known process structures and/or processes have not been described in detail in order not to unnecessarily obscure the present invention.

Hereinafter, the various embodiments of the present invention will be described in detail with reference to the attached drawings.

FIG. 1 is a simplified block diagram illustrating a configuration of a data storage device 10 in accordance with an embodiment of the present disclosure. In the present embodiment, the data storage device 10 may store data accessed by a host device (not shown) such as a cellular phone, an MP3 player, a laptop computer, a desktop computer, a game machine, a TV, and an in-vehicle infotainment system. The data storage device 10 may also be referred to as a memory system.

The data storage device 10 may be formed as any one of various kinds of storage devices and may be coupled to a host device via a suitable of host interface employing a suitable transfer protocol for the host device. For example, the data storage device 10 may be configured as any one of various kinds of storage devices such as a solid-state drive (SSD), an MMC, eMMC, RS-MMC, or micro-MMC type multimedia card, an SD, mini-SD, micro-SD type secure digital card, a universal serial bus (USB) storage device, a universal flash storage (UFS) device, a personal computer memory card international association (PCMCIA) card type storage device, a peripheral component interconnection (PCI) card type storage device, a PCI-express (PCI-E) type storage device, a compact flash (CF) card, a smart media card, a memory stick and the like.

The data storage device 10 may be manufactured in the form of any one of various package types. For instance, the data storage device 10 may be manufactured in the form of any one of various package types such as a package on package (POP) type, a system in package (SIP) type, a system on chip (SOC) type, a multi-chip package (MCP) type, a chip on board (COB) type, a wafer-level fabricated package (WFP) type, and a wafer-level stack package (WSP) type.

Referring to FIG. 1, the data storage device 10 may include a nonvolatile memory device 100, and a controller 200.

The nonvolatile memory device 100 may be operated as a storage medium of the data storage device 10. The nonvolatile memory device 100 may be formed of any one of various types of nonvolatile memory devices such as a NAND flash memory device, a NOR flash memory device, a ferroelectric random-access memory (FRAM) using a ferroelectric capacitor, a magnetic random-access memory (MRAM) using a tunneling magneto-resistive (TMR) layer, a phase change random-access memory (PRAM) using a chalcogenide alloy, and a resistive random-access memory (RERAM) using a transition metal oxide, which are classified according to the type of memory cells.

In FIG. 1, there is illustrated an example in which the data storage device 10 include a single nonvolatile memory device 100, but this is only for the sake of convenience in explanation. For example, the data storage device 10 may include a plurality of nonvolatile memory devices.

The nonvolatile memory device 100 may include a memory cell array having a plurality of memory cells which are respectively disposed at intersections of a plurality of bit lines (not shown) and a plurality of word lines (not shown). The memory cell array may include a plurality of planes. Each plane may include a plurality of memory blocks. Each of the memory blocks may include a plurality of pages.

For example, each of the memory cells of the memory cell array may be a single-level cell (SLC) capable of storing single-bit data, a multi-level cell (MLC) capable of storing 2-bit data, a triple-level cell (TLC) capable of 3-bit data, or a quad-level cell (QLC) capable of storing 4-bit data. The memory cell array may include at least one or more of the single-level cells, the multi-level cells, the triple-level cells, and the quad-level cells. The memory cell array may include memory cells arranged in a two-dimensional horizontal structure, or memory cells arranged in a three-dimensional vertical structure.

The controller 200 may include a host interface (Host I/F) 210, a processor 220, a random-access memory (RAM) 230, and a memory interface (Memory I/F) 240.

The host interface 210 may interface a host device (not shown) with the data storage device 10. For instance, the host interface 210 may communicate with a host device using any one of standard transfer protocols such as universal serial bus (USB), universal flash storage (UFS), multimedia card (MMC), parallel advanced technology attachment (PATA), serial advanced technology attachment (SATA), small computer system interface (SCSI), serial attached SCSI (SAS), peripheral component interconnection (PCI), PCI express (PCI-E), and the like.

The processor 220 may be configured as a micro control unit (MCU), or a central processing unit (CPU). The processor 220 may process a request transmitted from the host device. To process the request, the processor 220 may drive a code-type instruction or algorithm, i.e., software. The software may be loaded on the RAM 230. The processor may control the various internal function blocks of the controller. The processor may control the nonvolatile memory device 100.

The RAM 230 may be formed of a dynamic RAM (DRAM) or a static RAM (SRAM). The RAM 230 may store software which is driven by the processor 220. Furthermore, the RAM 230 may store data for driving the software. The RAM 230 may operate as a working memory of the processor 220.

Figure 2:
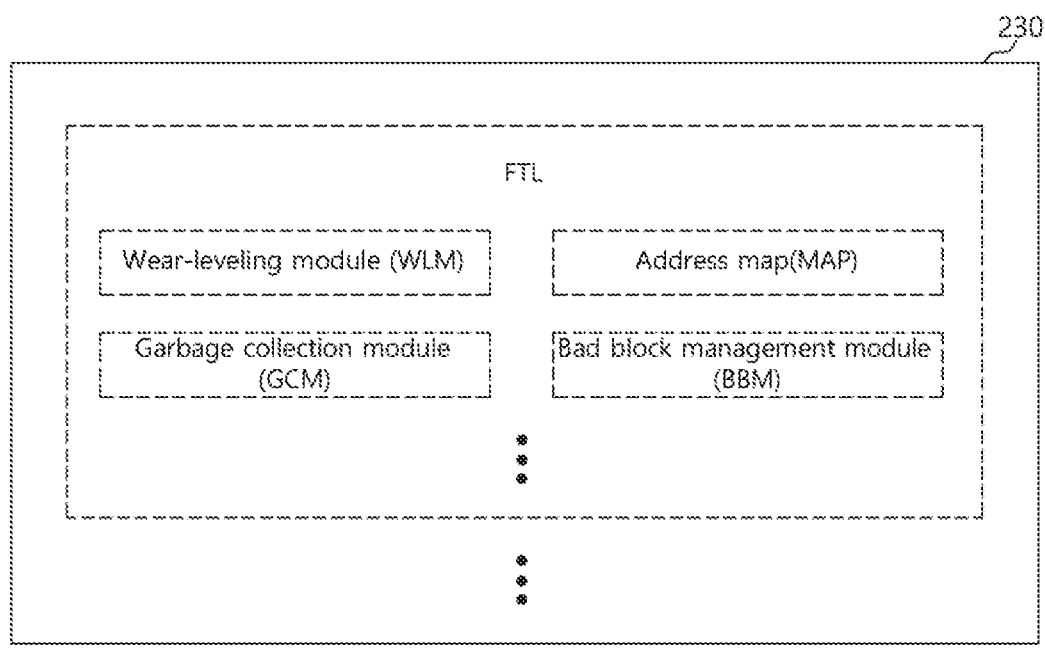
FIG. 2 is a diagram illustrating a software which is stored in a random-access memory and driven by a processor of the data storage device shown in FIG. 1.

FIG. 2 is a diagram illustrating an example of the software which is stored in the RAM 230 and driven by the processor 220.

In an embodiment the nonvolatile memory device 100 may be formed of a flash memory device and the processor 220 may control an inherent operation of the nonvolatile memory device 100, by driving software referred to as a flash translation layer (FTL), to provide device compatibility to the host device. Through the operation of the flash translation layer FTL, the host device may recognize and use the data storage device 10 as a general data storage device such as a hard disk. The flash translation layer FTL loaded on the random-access memory 230 may be formed of modules for performing various functions, and metadata needed for driving the modules.

Referring to FIG. 2, the flash translation layer FTL may include a wear-leveling module WLM, an address map MAP, a garbage collection module GCM, a bad block management module BBM, and so forth. It is noted that the configuration of the flash translation layer FTL is not limited to the above-mentioned modules. For example, the flash translation layer FTL may further include other modules such as a sudden power-off management module provided to cope with sudden power-off.

The wear-leveling module WLM may manage a wear level of memory blocks of the nonvolatile memory device 100. The memory cells of the nonvolatile memory device 100 may be worn out by repetitive erase operations and program operations. A worn memory cell may cause a defect (e.g., a physical defect). The wear-leveling module WLM may manage the memory blocks such that respective program-erase counts of the memory blocks are equalized to prevent a certain memory block from being worn earlier than the other memory blocks are. In other words, the wear-leveling module WLM may manage the wear levels of all memory blocks of the nonvolatile memory device 100 such that the wear levels remain similar to each other.

The address map MAP may store address mapping information for an address translation operation. In the case where the host device accesses the data storage device 10 (e.g., in the case where a read or write operation is requested), the host device may provide a logical address to the data storage device 10. The flash translation layer FTL may translate the provided logical address into an actual address, i.e., a physical address, of the nonvolatile memory device 100, and perform the requested operation with reference to the translated physical address.

The garbage collection module GCM may manage the nonvolatile memory device 100 to perform an operation of collecting, in one memory block, valid data that have been dispersedly stored in the memory blocks of the nonvolatile memory device 100, and then erasing invalid data so as to free the storage space of the memory blocks.

When the nonvolatile memory device 100 is a flash memory device, the nonvolatile memory device may not support a data overwrite operation due to the structural characteristics of the flash memory. Also, when data is reprogrammed to a memory cell having a programmed state, reliability of data stored in the corresponding memory cell is not secured. Hence, programming data to a memory cell which already has been programmed requires that the programmed cell is erased via an erase operation.

Generally, a relatively long time is needed for performing an erase operation on the nonvolatile memory device 100 because the erase operation is performed on a memory block basis. Therefore, if a memory cell corresponding to an address to be programmed is in a programmed state, the processor 220 may program, in lieu of erasing the corresponding memory and programming data thereto, data to any other memory cell having an erased state. In this case, data stored in the memory cell to be originally programmed may become invalid data, and data stored in the any other memory cell may become valid data.

Due to the foregoing operation of the processor 220, valid data and invalid data are mixed in the nonvolatile memory device 100. As needed, the processor 220 may perform a series of operations for collecting dispersed valid data in one place, e.g., one memory block, by driving the garbage collection module GCM, and then erasing invalid data. These series of operations are referred to as a garbage collection operation.

The bad block management module BBM may manage a defective memory block among the memory blocks of the nonvolatile memory device 100. For example, a defect (e.g., a physical defect) may occur in a worn memory cell. Data stored in the defective memory cell may not be normally read. Furthermore, data may not be normally stored to the defective memory cell. The bad block management module BBM may manage a defective memory block, i.e., a memory block including a defective memory cell, in a way that the defective memory block is not used any longer.

If the data storage device 10 is powered on, the processor 220 may sequentially perform, using the bad block management module BBM, a primary bad block scan operation and a secondary bad block scan operation on all memory blocks (not shown) included in the nonvolatile memory device 100.

The primary bad block scan operation may include an erase operation and an erase verify operation on all the memory blocks included in the nonvolatile memory device 100. The erase operation and the erase verify operation are well known to those skilled in this art; therefore, further detailed description thereof will be omitted.

Using the bad block management module BBM, the processor 220 may register and manage, as primary bad blocks, memory blocks on which erase fails have occurred among all the memory blocks included in the nonvolatile memory device 100. The primary bad blocks include memory cells each of which cannot have an erased state.

The secondary bad block scan operation may be an operation of detecting memory blocks having poor retention characteristics among memory blocks (hereinafter, referred to as "normal memory blocks") other than the primary bad blocks among all the memory blocks included in the nonvolatile memory device 100.

The memory cells of the nonvolatile memory device 100 formed of the flash memory device may be configured to trap charges when a program operation is performed. In other words, programmed memory cells remain charged with charges. If a long period of time has passed after the memory cells have been programmed, or if the memory cells have been worn, charges charged in the memory cells may leak despite the nonvolatile characteristics of the memory cells. The leakage of charges charged in the memory cells means deterioration in retention characteristics of the memory cells.

Figure 3:
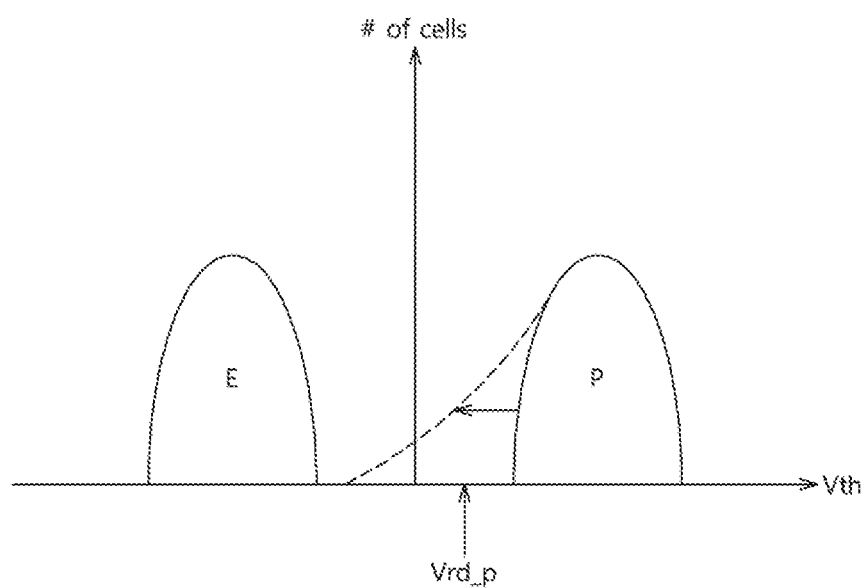
FIG. 3 is a diagram illustrating an example of a threshold voltage distribution of memory cells having deteriorated retention characteristics.

FIG. 3 is a diagram illustrating an example of a threshold voltage distribution of memory cells having deteriorated retention characteristics. For the sake of convenience in description, FIG. 3, illustrates a programmed state P of a single-level cell SLC. However, the shape of a threshold voltage distribution of memory cells having deteriorated retention characteristics in each of first to third programmed states P1 to P3 (not shown) of MLCs and first to seventh programmed states of TLCs may be the same as that of FIG. 3.

The threshold voltage distribution of the memory cells having deteriorated retention characteristics may change into a shape that extends a long length toward a state having lower threshold voltage, for example, the erased state E as shown in FIG. 3. In other words, the memory cells having deteriorated retention characteristics may occur when charges therein are discharged accidentally, i.e., not by design. In this case, when a read voltage Vrd_P is applied to the memory cells, memory cells are supposed to be in the off state are determined to be in an on state. These memory cells that are determined to be in the on state may be detected as error bits. If the number of error bits exceeds an error correcting capability of the memory system, then error correction of data read from the memory cells is determined to be impossible and therefore a read fail occurs.

Furthermore, a problem may occur in which the retention characteristic of a certain word line in a certain block among the plurality of memory blocks included in the nonvolatile memory device 100 excessively deteriorates compared to that of the other word lines of the other blocks. This also may cause a read fail.

Hence, during a boot-up operation of the data storage device 10, the processor 220 may perform the above-mentioned primary bad block scan operation using the bad block management module BBM and then detect and register primary bad blocks. Thereafter, the processor 220 may perform a secondary bad block scan operation on normal memory blocks using the bad block management module BBM to register memory blocks including word lines having poor retention characteristcs as bad blocks at the initial stage.

The secondary bad block scan operation may include performing a program operation on the normal memory blocks such that the normal memory blocks have a first programmed state, performing a predetermined number of erase operations on the selected certain memory block among the memory blocks of the nonvolatile memory device 100, and performing a read operation on the normal memory blocks programmed to the first programmed state. For example, the first programmed state may be a programmed state P in the case of an SLC, a second programmed state P2 or a third programmed state P3 in the case of an MLC, and a sixth programmed state P6 or a seventh programmed state P7 in the case of an TLC. In the case of an MLC or a TLC, a program operation may be performed such that the memory cell has a programmed state which is farthest from or second farthest from the erased state E.

The processor 220, using the bad block management module BBM, may select a certain memory block, and may perform a predetermined number of erase operations on the selected certain memory block. For example, although the predetermined number of erase operations may be 3000 or more, it is not particularly limited thereto. The certain memory block may be selected from among the primary bad blocks or the normal memory blocks.

During the secondary bad block scan operation, the processor 220 may perform a read operation on the normal memory blocks using the bad block management module BBM after the program operation for the above-described first programmed state and the erase operations to the selected certain memory block. A read voltage to be used in the read operation may be a read voltage corresponding to the first programmed state.

Using the bad block management module BBM, the processor 220 may register and manage, as secondary bad blocks, memory blocks on which read fails have occurred as the result of the read operation among the normal memory blocks during the secondary bad block scan operation. The secondary bad blocks may be memory blocks including memory cells having especially poor retention characteristics.

As described above, in accordance with embodiments, during the boot-up operation of the data storage device, not only an erase-failed memory block (i.e., the primary bad blocks) but also memory blocks having poor retention characteristics (i.e., the secondary bad blocks) may be registered and managed as bad blocks at the initial stage. Therefore, a read fail may be prevented from occurring due to deterioration in retention characteristics during the use of the data storage device.

The memory interface 240 may control the nonvolatile memory device 100 under control of the processor 220. The memory interface 240 may also be referred to as a memory controller. The memory interface 240 may provide control signals to the nonvolatile memory device 100. The control signals may include a command, an address, and/or the like, for controlling the nonvolatile memory device 100. The memory interface 240 may provide data to the nonvolatile memory device 100 or receive data from the nonvolatile memory device 100. The memory interface 240 may be coupled with the nonvolatile memory device 100. For example, as illustrated in FIG. 1, the memory interface 240 may be coupled with the nonvolatile memory device 100 through a channel CH including one or more signal lines.

Figure 4:
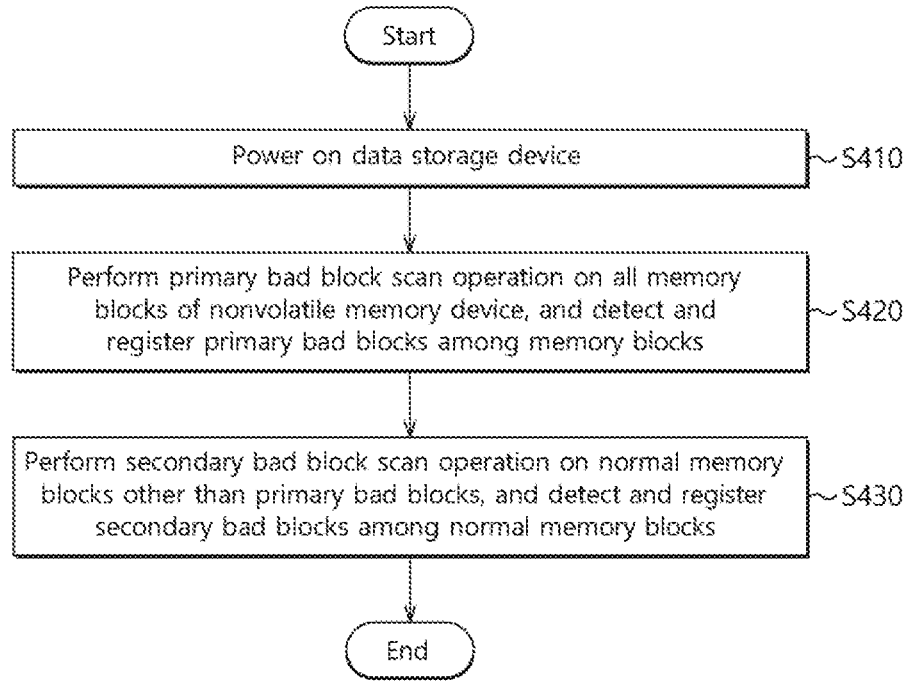
FIG. 4 is a flowchart of an operating method of a data storage device in accordance with an embodiment of the present disclosure.
Figure 5:
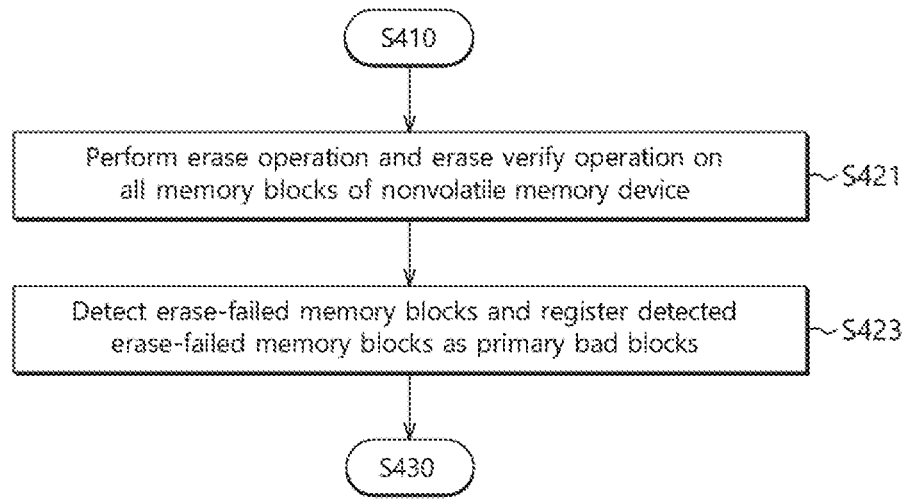
FIG. 5 is a flowchart illustrating in detail step S420 shown in FIG. 4.
Figure 6:
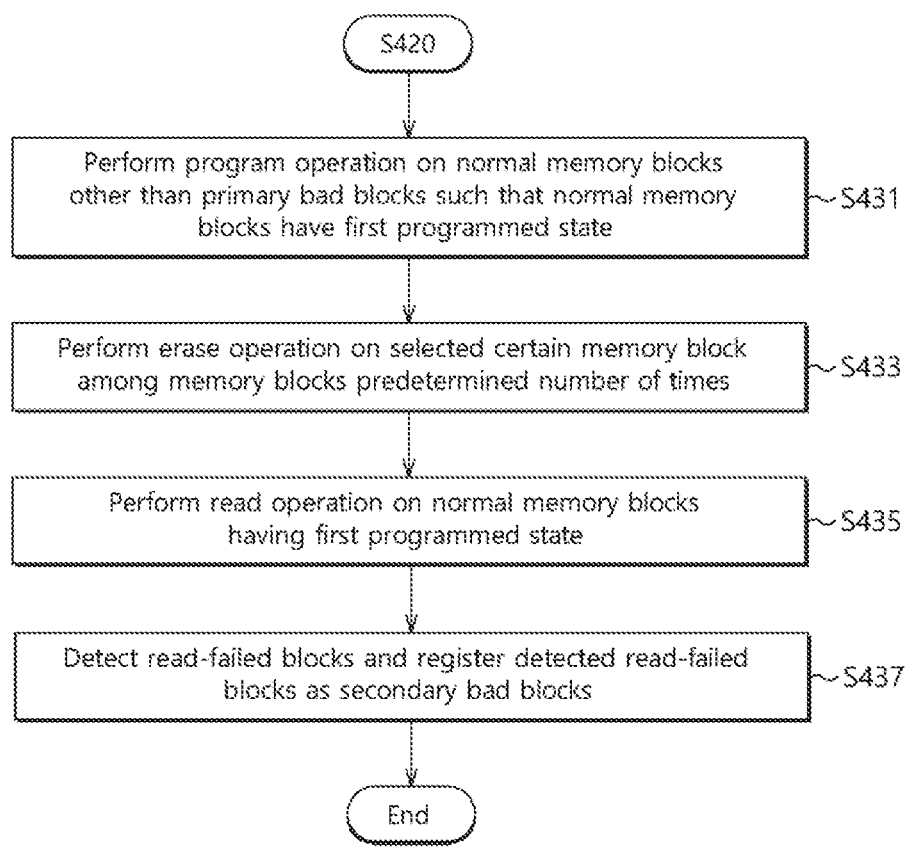
FIG. 6 is a flowchart illustrating in detail step S430 shown in FIG. 4.

FIG. 4 is a flowchart of an operating method of the data storage device, in accordance with an embodiment. FIG. 5 is a flowchart illustrating in more detail step S420 of FIG. 4, and FIG. 6 is a flowchart illustrating in more detail step S430 of FIG. 4, in accordance with an embodiment of the present invention. In the following description of the operating method of the data storage device in accordance with an embodiment with reference with FIGS. 4 to 6, FIG. 1 or 2 may also be used for reference.

At step S410, the data storage device (10, refer to FIG. 1) may be powered on. If the data storage device 10 is powered on, the software, i.e., the flash translation layer FTL, stored in the nonvolatile iG memory device 100 may be loaded on the RAM 230 of the data storage device 10.

At step S420, the processor (220, refer to FIG. 1) may perform a primary bad block scan operation on all the memory blocks included in the nonvolatile memory device 100 using the bad block management module (BBM, refer to FIG. 2) included in the flash translation layer FTL, and detect and register primary bad blocks among the memory blocks.

Step S420 will be described in detail below with reference to FIG. 5.

At step S421, the processor 220 may perform an erase operation and an erase verify operation on all the memory blocks of the nonvolatile memory device 100 using the bad block management module BBM.

At step S423, the processor 220 may detect erase-failed memory blocks among the memory blocks of the nonvolatile memory device 100 using the bad block management module BBM, and register the detected erase-failed memory blocks as the primary bad blocks.

At step S430, the processor 220 may perform a secondary bad block scan operation on normal memory blocks other than the primary bad blocks among the memory blocks of the nonvolatile memory device 100 using the bad block management module BBM, and then detect and register secondary bad blocks among the normal memory blocks.

Step S430 will be described in detail below with reference to FIG. 6.

At step S431, the processor 220 may perform a program operation on the normal memory blocks using the bad block management module BBM such that the normal memory blocks have the above-described first programmed state.

At step S433, the processor 220 may select a certain memory block among the memory blocks of the nonvolatile memory device 100 using the bad block management module BBM, and perform a predetermined number of erase operations on the selected certain memory block.

At step S435, the processor 220 may perform, using the bad block management module BBM, a read operation on the normal memory blocks programmed to the first programmed state.

At step S437, the processor 220 may detect read-failed memory blocks using the bad block management module BBM, and register the detected read-failed memory blocks as secondary bad blocks.

In accordance with embodiments, during a boot-up operation of a data storage device, not only an erase-failed memory block (i.e., the primary bad blocks) but also memory blocks having poor retention characteristics (i.e., the secondary bad blocks) may be registered and managed as bad blocks at the initial stage. Therefore, a read fail may be prevented from occurring due to deterioration in retention characteristics of a certain memory block during the use of the data storage device.

Figure 7:
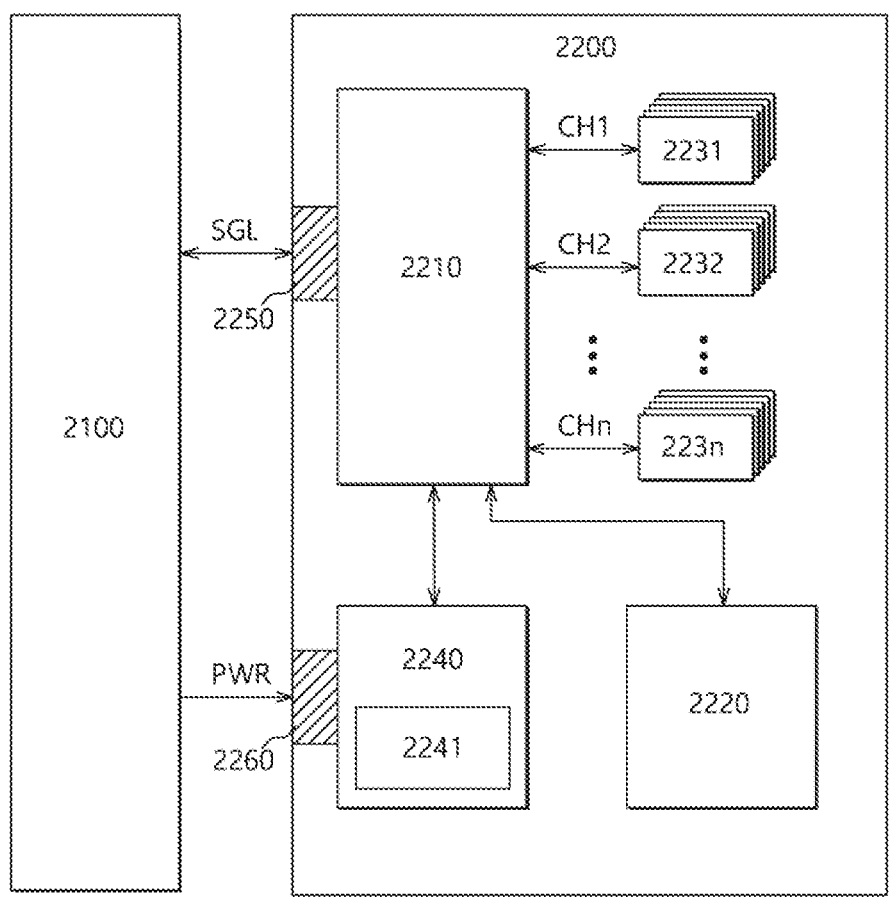
FIG. 7 is a diagram illustrating an example of a data processing system including a solid-state drive (SSD) in accordance with an embodiment of the present disclosure.

FIG. 7 is a diagram illustrating an example of a data processing system including a solid-state drive (SSD) in accordance with an embodiment. Referring to FIG. 7, a data processing system 2000 may include a host apparatus 2100 and an SSD 2200.

The SSD 2200 may include a controller 2210, a buffer memory device 2220, nonvolatile memory devices 2231 to 223n, a power supply 2240, a signal connector 2250, and a power connector 2260.

The controller 2210 may control an overall operation of the SSD 2220.

The buffer memory device 2220 may temporarily store data to be stored in the nonvolatile memory devices 2231 to 223n. The buffer memory device 2220 may temporarily store data read from the nonvolatile memory devices 2231 to 223n. The data temporarily stored in the buffer memory device 2220 may be transmitted to the host apparatus 2100 or the nonvolatile memory devices 2231 to 223n according to control of the controller 2210.

The nonvolatile memory devices 2231 to 223n may be used as a storage medium of the SSD 2200. The nonvolatile memory devices 2231 to 223n may be coupled to the controller 2210 through a plurality of channels CH1 to CHn. The nonvolatile memory devices coupled to the one channel may be coupled to the same signal bus and the same data bus.

The power supply 2240 may provide power PWR input through the power connector 2260 to the inside of the SSD 2200. The power supply 2240 may include an auxiliary power supply 2241. The auxiliary power supply 2241 may supply the power so that the SSD 2200 is normally terminated even when sudden power-off occurs. The auxiliary power supply 2241 may include large capacity capacitors capable of charging the power PWR.

The controller 2210 may exchange a signal SGL with the host apparatus 2100 through the signal connector 2250. The signal SGL may include a command, an address, data, and the like. The signal connector 2250 may be configured as various types of connectors according to an interfacing method between the host apparatus 2100 and the SSD 2200.

Figure 8:
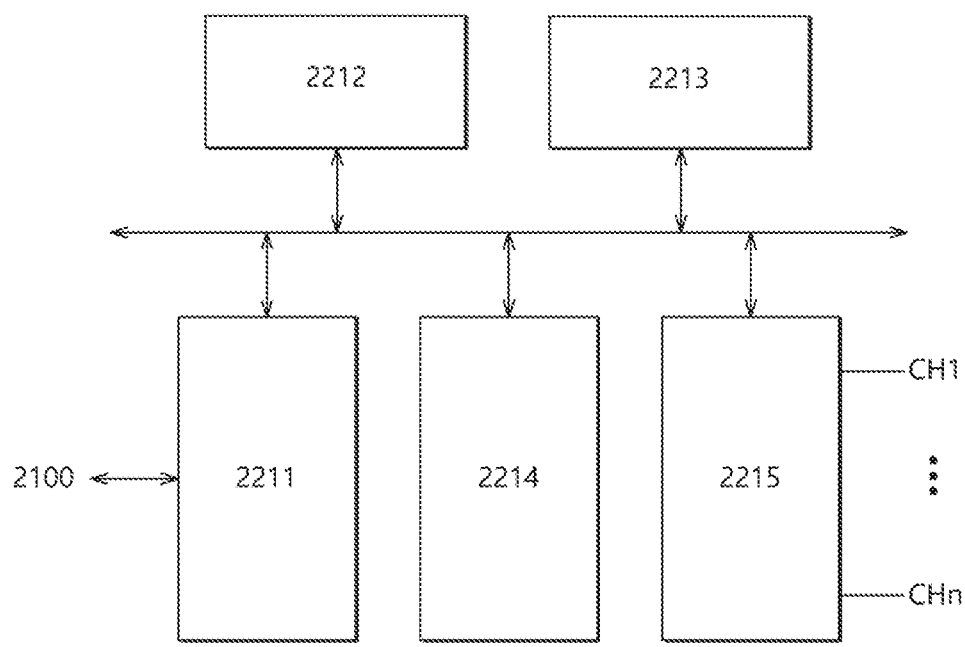
FIG. 8 is a diagram illustrating an example of a controller illustrated in FIG. 7.

FIG. 8 is a diagram illustrating an example of the controller 2210 of FIG. 7. Referring to FIG. 8, the controller 2210 may include a host interface unit 2211, a control unit 2212, a random-access memory (RAM) 2213, an error correction code (ECC) unit 2214, and a memory interface unit 2215.

The host interface unit 2211 may perform interfacing between the host apparatus 2100 and the SSD 2200 according to a protocol of the host apparatus 2100. For example, the host interface unit 2211 may communicate with the host apparatus 2100 through any one among a secure digital protocol, a universal serial bus (USB) protocol, a multimedia card (MMC) protocol, an embedded MMC (eMMC) protocol, a personal computer memory card international association (PCMCIA) protocol, a parallel advanced technology attachment (PATA) protocol, a serial advanced technology attachment (SATA) protocol, a small computer system interface (SCSI) protocol, a serial attached SCSI (SAS) protocol, a peripheral component interconnection (PCI) protocol, a PCI Express (PCI-E) protocol, and a universal flash storage (UFS) protocol. The host interface unit 2211 may perform a disc emulation function that the host apparatus 2100 recognizes the SSD 2200 as a general-purpose data storage apparatus, for example, a hard disc drive HDD.

The control unit 2212 may analyze and process the signal SGL input from the host apparatus 2100. The control unit 2212 may control operations of internal functional blocks according to firmware and/or software for driving the SDD 2200. The RAM 2213 may be operated as a working memory for driving the firmware or software.

The ECC unit 2214 may generate parity data for the data to be transferred to the nonvolatile memory devices 2231 to 223n. The generated parity data may be stored in the nonvolatile memory devices 2231 to 223n together with the data. The ECC unit 2214 may detect errors for data read from the nonvolatile memory devices 2231 to 223n based on the parity data. When detected errors are within a correctable range, the ECC unit 2214 may correct the detected errors.

The memory interface unit 2215 may provide a control signal such as a command and an address to the nonvolatile memory devices 2231 to 223n according to control of the control unit 2212. The memory interface unit 2215 may exchange data with the nonvolatile memory devices 2231 to 223n according to control of the control unit 2212. For example, the memory interface unit 2215 may provide data stored in the buffer memory device 2220 to the nonvolatile memory devices 2231 to 223n or provide data read from the nonvolatile memory devices 2231 to 223n to the buffer memory device 2220.

Figure 9:
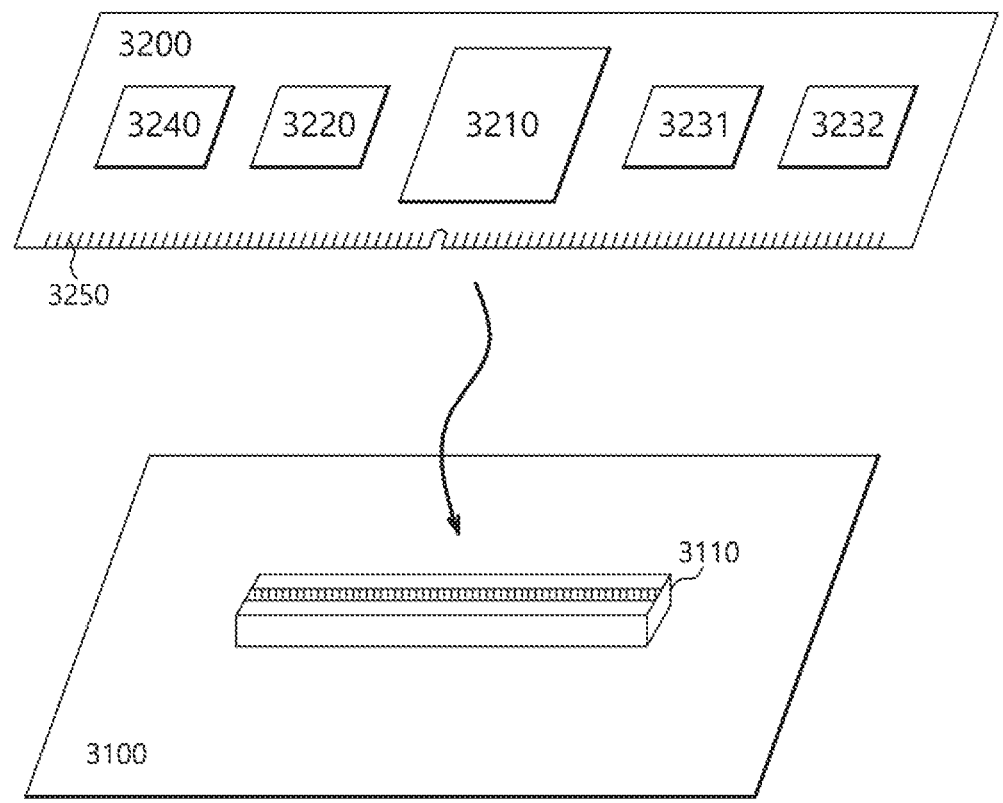
FIG. 9 is a diagram illustrating an example of a data processing system including a data storage apparatus in accordance with an embodiment of the present disclosure.

FIG. 9 is a diagram illustrating an example of a data processing system including a data storage apparatus in accordance with an embodiment. Referring to FIG. 9, a data processing system 3000 may include a host apparatus 3100 and a data storage apparatus 3200.

The host apparatus 3100 may be configured in a board form such as a printed circuit board (PCB). Although not shown in FIG. 9, the host apparatus 3100 may include internal functional blocks configured to perform functions of the host apparatus 3100.

The host apparatus 3100 may include a connection terminal 3110 such as a socket, a slot, or a connector. The data storage apparatus 3200 may be mounted on the connection terminal 3110.

The data storage apparatus 3200 may be configured in a board form such as a PCB. The data storage apparatus 3200 may refer to a memory module or a memory card. The data storage apparatus 3200 may include a controller 3210, a buffer memory device 3220, nonvolatile memory devices 3231 to 3232, a power management integrated circuit (PMIC) 3240, and a connection terminal 3250.

The controller 3210 may control an overall operation of the data storage apparatus 3200. The controller 3210 may be configured to have the same configuration as the controller 2210 illustrated in FIG. 8.

The buffer memory device 3220 may temporarily store data to be stored in the nonvolatile memory devices 3231 and 3232. The buffer memory device 3220 may temporarily store data read from the nonvolatile memory devices 3231 and 3232. The data temporarily stored in the buffer memory device 3220 may be transmitted to the host apparatus 3100 or the nonvolatile memory devices 3231 and 3232 according to control of the controller 3210.

The nonvolatile memory devices 3231 and 3232 may be used as a storage medium of the data storage apparatus 3200.

The PMIC 3240 may provide power input through the connection terminal 3250 to the inside of the data storage apparatus 3200. The PMIC 3240 may manage the power of the data storage apparatus 3200 according to control of the controller 3210.

The connection terminal 3250 may be coupled to the connection terminal 3110 of the host apparatus 3100. A signal such as a command, an address, and data and power may be transmitted between the host apparatus 3100 and the data storage apparatus 3200 through the connection terminal 3250. The connection terminal 3250 may be configured in various forms according to an interfacing method between the host apparatus 3100 and the data storage apparatus 3200. The connection terminal 3250 may be arranged in any one side of the data storage apparatus 3200.

Figure 10:
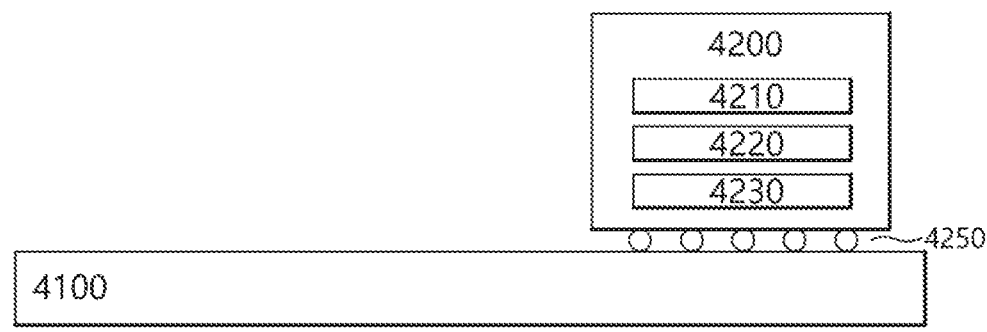
FIG. 10 is a diagram illustrating an example of a data processing system including a data storage apparatus in accordance with an embodiment of the present disclosure.

FIG. 10 is a diagram illustrating an example of a data processing system including a data storage apparatus in accordance with an embodiment. Referring to FIG. 10, a data processing system 4000 may include a host apparatus 4100 and a data storage apparatus 4200.

The host apparatus 4100 may be configured in a board form such as a PCB. Although not shown in FIG. 10, the host apparatus 4100 may include internal functional blocks configured to perform functions of the host apparatus 4100.

The data storage apparatus 4200 may be configured in a surface mounting packaging form. The data storage apparatus 4200 may be mounted on the host apparatus 4100 through a solder ball 4250. The data storage apparatus 4200 may include a controller 4210, a buffer memory device 4220, and a nonvolatile memory device 4230.

The controller 4210 may control an overall operation of the data storage apparatus 4200. The controller 4210 may be configured to have the same configuration as the controller 2210 illustrated in FIG. 8.

The buffer memory device 4220 may temporarily store data to be stored in the nonvolatile memory device 4230. The buffer memory device 4220 may temporarily store data read from the nonvolatile memory device 4230. The data temporarily stored in the buffer memory device 4220 may be transmitted to the host apparatus 4100 or the nonvolatile memory device 4230 through control of the controller 4210.

The nonvolatile memory device 4230 may be used as a storage medium of the data storage apparatus 4200.

Figure 11:
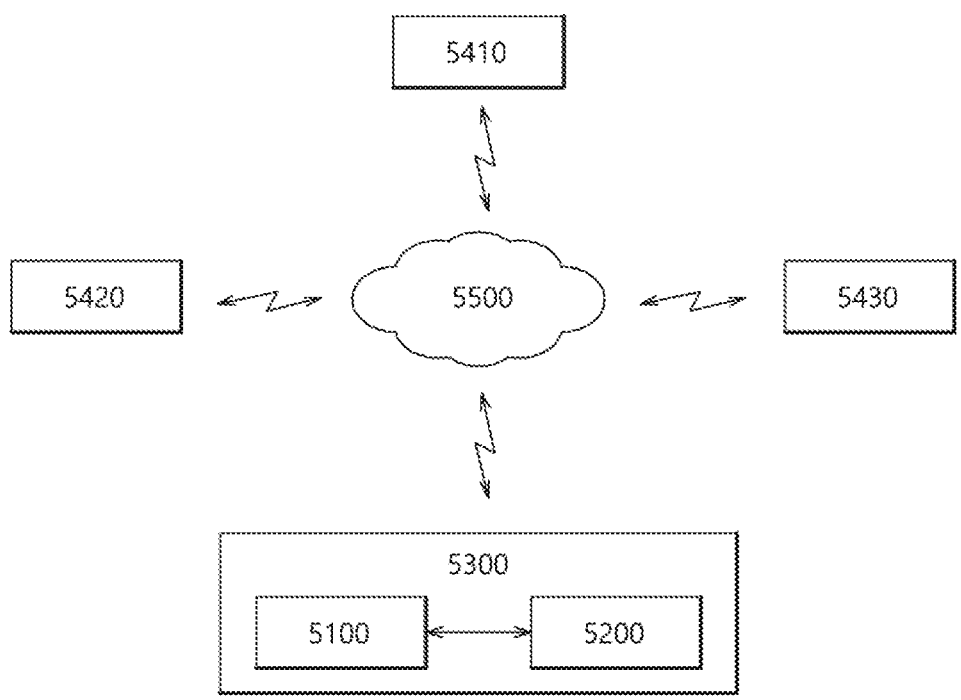
FIG. 11 is a diagram illustrating an example of a network system including a data storage apparatus in accordance with an embodiment of the present disclosure.

FIG. 11 is a diagram illustrating an example of a network system 5000 including a data storage apparatus in accordance with an embodiment. Referring to FIG. 11, the network system 5000 may include a server system 5300 and a plurality of client systems 5410 to 5430 which are coupled through a network 5500.

The server system 5300 may serve data in response to requests of the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host apparatus 5100 and a data storage apparatus 5200. The data storage apparatus 5200 may be configured as the data storage apparatus 10 of FIG. 1, the data storage apparatus 2200 of FIG. 7, the data storage apparatus 3200 of FIG. 9, or the data storage apparatus 4200 of FIG. 10.

Figure 12:
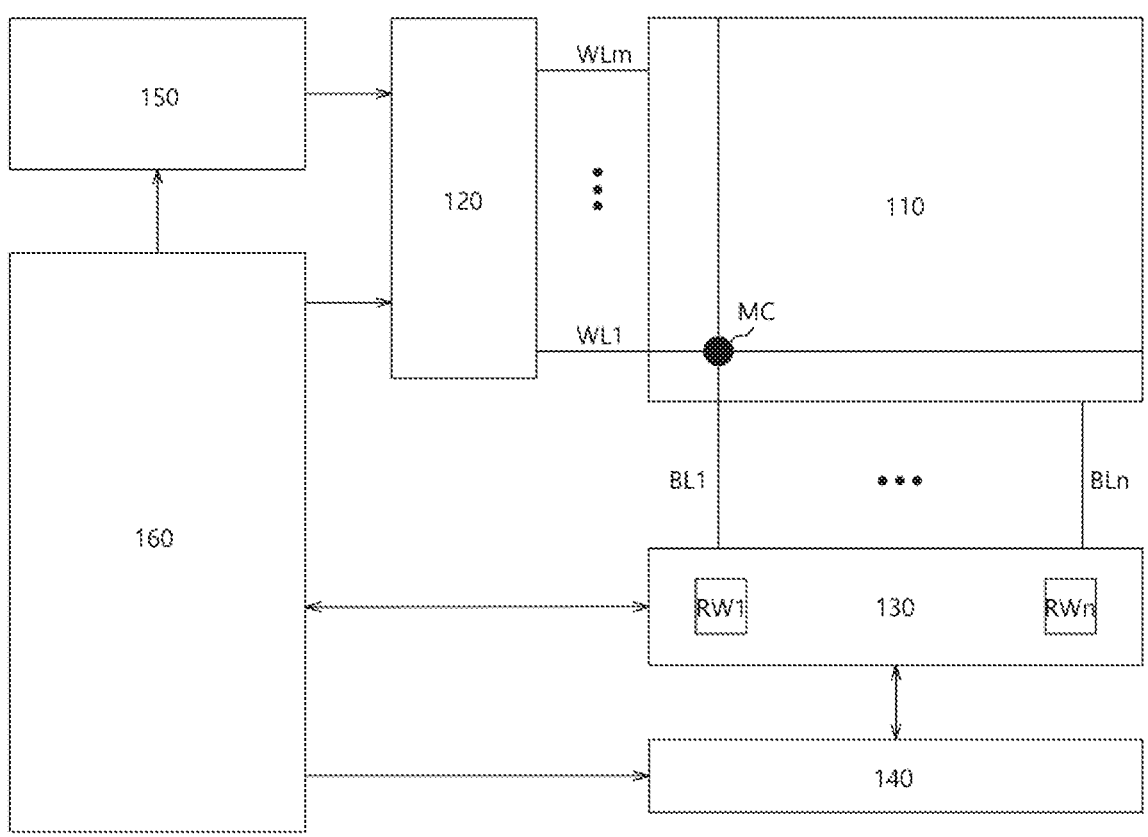
FIG. 12 is a simplified block diagram illustrating an example of a nonvolatile memory device included in a data storage apparatus in accordance with an embodiment of the present disclosure.

FIG. 12 is a simplified block diagram illustrating an example of a nonvolatile memory device included in a data storage apparatus in accordance with an embodiment. Referring to FIG. 12, a nonvolatile memory device 100 may include a memory cell array 110, a row decoder 120, a column decoder 140, a data read/write block 130, a voltage generator 150, and a control logic 160.

The memory cell array 110 may include memory cells MC arranged in regions in which word lines WL1 to WLm and bit lines BL1 to BLn cross to each other.

The row decoder 120 may be coupled to the memory cell array 110 through the word lines WL1 to WLm. The row decoder 120 may operate through control of the control logic 160. The row decoder 120 may decode an address provided from an external apparatus (not shown). The row decoder 120 may select and drive the word lines WL1 to WLm based on a decoding result. For example, the row decoder 120 may provide a word line voltage provided from the voltage generator 150 to the word lines WL1 to WLm.

The data read/write block 130 may be coupled to the memory cell array 110 through the bit lines BL1 to BLn. The data read/write block 130 may include read/write circuits RW1 to RWn corresponding to the bit lines BL1 to BLn. The data read/write block 130 may operate according to control of the control logic 160. The data read/write block 130 may operate as a write driver or a sense amplifier according to an operation mode. For example, the data read/write block 130 may operate as the write driver configured to store data provided from an external apparatus in the memory cell array 110 in a write operation. In another example, the data read/write block 130 may operate as the sense amplifier configured to read data from the memory cell array 110 in a read operation.

The column decoder 140 may operate though control of the control logic 160. The column decoder 140 may decode an address provided from an external apparatus (not shown). The column decoder 140 may couple the read/write circuits RW1 to RWn of the data read/write block 130 corresponding to the bit lines BL1 to BLn and data input/output (I/O) lines (or data I/O buffers) based on a decoding result.

The voltage generator 150 may generate voltages used for an internal operation of the nonvolatile memory device 100. The voltages generated through the voltage generator 150 may be applied to the memory cells of the memory cell array 110. For example, a program voltage generated in a program operation may be applied to word lines of memory cells in which the program operation is to be performed. In another example, an erase voltage generated in an erase operation may be applied to well regions of memory cells in which the erase operation is to be performed. In another example, a read voltage generated in a read operation may be applied to word lines of memory cells in which the read operation is to be performed.

The control logic 160 may control an overall operation of the nonvolatile memory device 100 based on a control signal provided from an external apparatus. For example, the control logic 160 may control an operation of the nonvolatile memory device 100 such as a read operation, a write operation, an erase operation of the nonvolatile memory device 100.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A data storage device comprising:
 a nonvolatile memory device including a plurality of memory blocks;
 a random-access memory including a bad block management module configured to register and manage bad blocks included in the plurality of memory blocks; and
 a processor configured to detect primary bad blocks that are erase-failed memory blocks by performing a primary bad block scan operation on all the memory blocks using the bad block management module, detect secondary bad blocks that are memory blocks having poor retention characteristics by performing a secondary bad block scan operation on normal memory blocks that are erase-passed memory blocks other than the primary bad blocks among all the memory blocks, and register the detected primary bad blocks and the detected secondary bad blocks as initial bad blocks,
 wherein the secondary bad block scan operation includes programming the normal memory blocks to a first programmed state, erasing one memory block selected from among all the memory blocks by a predetermined number of times, reading the normal memory blocks, and detecting read-failed memory blocks among the normal memory blocks.

2. The data storage device according to claim 1, wherein, when the data storage device is powered on, the processor sequentially performs the primary bad block scan operation and the secondary bad block scan operation on the plurality of memory blocks using the bad block management module.

3. The data storage device according to claim 1, wherein the primary bad block scan operation includes an erase operation and an erase verify operation on all the memory blocks.

4. The data storage device according to claim 1, wherein the first programmed state is a programmed state having a threshold voltage distribution farthest from or second farthest from an erased state.

5. The data storage device according to claim 1, wherein the one certain memory block is selected from among the primary bad blocks or the normal memory blocks.

6. An operating method of a data storage device including a nonvolatile memory device, and a controller configured to control an operation of the nonvolatile memory device, the operating method comprising:
 performing a primary bad block scan operation on all memory blocks included in the nonvolatile memory device;
 detecting primary bad blocks that are erase-failed memory blocks among all the memory blocks;
 performing a secondary bad block scan operation on normal memory blocks that are erase-passed memory blocks other than the primary bad blocks among all the memory blocks;
 detecting secondary bad blocks that are memory blocks having poor retention characteristics among the normal memory blocks; and
 registering the detected primary bad blocks and the detected secondary bad blocks as the initial bad blocks,
 wherein the performing of the secondary bad block scan operation includes programming the normal memory blocks to a first programmed state, erasing one memory block selected from among all the memory blocks by a predetermined number of times, reading the normal memory blocks, and detecting read-failed memory blocks among the normal memory blocks as the secondary bad blocks.

7. The operating method according to claim 6, wherein the primary bad block scan operation and the secondary bad block scan operation are performed during a boot-up operation of the data storage device.

8. The operating method according to claim 6, wherein the detecting of the primary bad blocks comprises:
 performing an erase operation and an erase verify operation on the memory blocks; and
 detecting erase-failed memory blocks among all the memory blocks as the primary bad blocks.

9. The operating method according to claim 6, wherein the first programmed state is a programmed state having a threshold voltage distribution farthest from or second farthest from an erased state.

10. The operating method according to claim 6, wherein the predetermined number of times is 3000 or more.

11. The operating method according to claim 6, wherein the one memory block is selected from among the primary bad blocks or the normal memory blocks.

12. A memory system comprising:
 a memory device including a plurality of memory blocks; and
 a controller suitable for:
 controlling, during booting the memory device, the memory device to perform a program operation to normal memory blocks that are erase-passed memory blocks among all the memory blocks such that the normal memory blocks have a predetermined threshold state;
 controlling the memory device to perform an erase operation a predetermined number of times to one memory block selected from among all the memory blocks;
 controlling the memory device to perform a read operation to the normal memory blocks with a read bias corresponding to the predetermined threshold state;
 determining one or more among the normal memory block, on which a read fail occurs, as memory blocks having poor retention characteristics; and determining the memory blocks having poor retention characteristics as initial bad blocks.

* * * * *